(12) United States Patent
Hshieh (10) Patent No.: US 8,058,670 B2
(45) Date of Patent: Nov. 15, 2011

(54) INSULATED GATE BIPOLAR TRANSISTOR (IGBT) WITH MONOLITHIC DEEP BODY CLAMP DIODE TO PREVENT LATCH-UP

(75) Inventor: Fwu-Iuan Hshieh, Saratoga, CA (US)

(73) Assignee: Force_MOS Technology Corporation (TW)

( * ) Notice: Subject to any disclaimer, the term of this patent is extended or adjusted under 35 U.S.C. 154(b) by 244 days.

(21) Appl. No.: 12/455,744

(22) Filed: Jun. 4, 2009

(65) Prior Publication Data

US 2010/0308370 A1 Dec. 9, 2010

(51) Int. Cl.
*H01L 29/739* (2006.01)
(52) U.S. Cl. . 257/136; 257/139; 257/365; 257/E29.197; 257/E29.201
(58) Field of Classification Search .................. 257/136, 257/139, 328–330, 341, 365, E29.201, E29.197, 257/E29.262, E27.022
See application file for complete search history.

(56) References Cited

U.S. PATENT DOCUMENTS

| | | | | |
|---|---|---|---|---|
| 5,702,961 A | * | 12/1997 | Park | 438/138 |
| 7,238,568 B2 | * | 7/2007 | Williams et al. | 438/243 |
| 2007/0114599 A1 | * | 5/2007 | Hshieh | 257/330 |

* cited by examiner

*Primary Examiner* — Victor A Mandala
*Assistant Examiner* — Whitney T Moore
(74) *Attorney, Agent, or Firm* — Bo-In Lin (57) ABSTRACT

A trench insulation gate bipolar transistor (IGBT) power device with a monolithic deep body clamp diode comprising a plurality of trench gates surrounded by emitter regions of a first conductivity type near a top surface of a semiconductor substrate of the first conductivity type encompassed in base regions of a second conductivity type. A collector region of the second conductivity type is disposed on a rear side opposite from the top surface of the semiconductor substrate corresponding to and underneath the trench gates surrounded by the emitter regions encompassed in the base regions constituting a plurality of insulation gate bipolar transistors (IGBTs). A deep dopant region of the second conductivity type having P-N junction depth deeper than the base region is disposed between and extending below the trench gates in the base region of the first conductivity type.

20 Claims, 7 Drawing Sheets

INSULATED GATE BIPOLAR TRANSISTOR (IGBT) WITH MONOLITHIC DEEP BODY CLAMP DIODE TO PREVENT LATCH-UP

BACKGROUND OF THE INVENTION

1. Field of the Invention

The invention relates generally to a device configuration and method of manufacturing an insulated gate bipolar transistor (IGBT). More particularly, this invention relates to an improved IGBT device configuration and manufacturing method for a trench IGBT that has a monolithic deep body clamp diode for preventing latch-up, and allowing reverse current to flow through the diode when the IGBT is turned off in many power switching applications such as inverter and H-Bridge motor switching circuits.

2. Description of the Relevant Art

Figure 1:
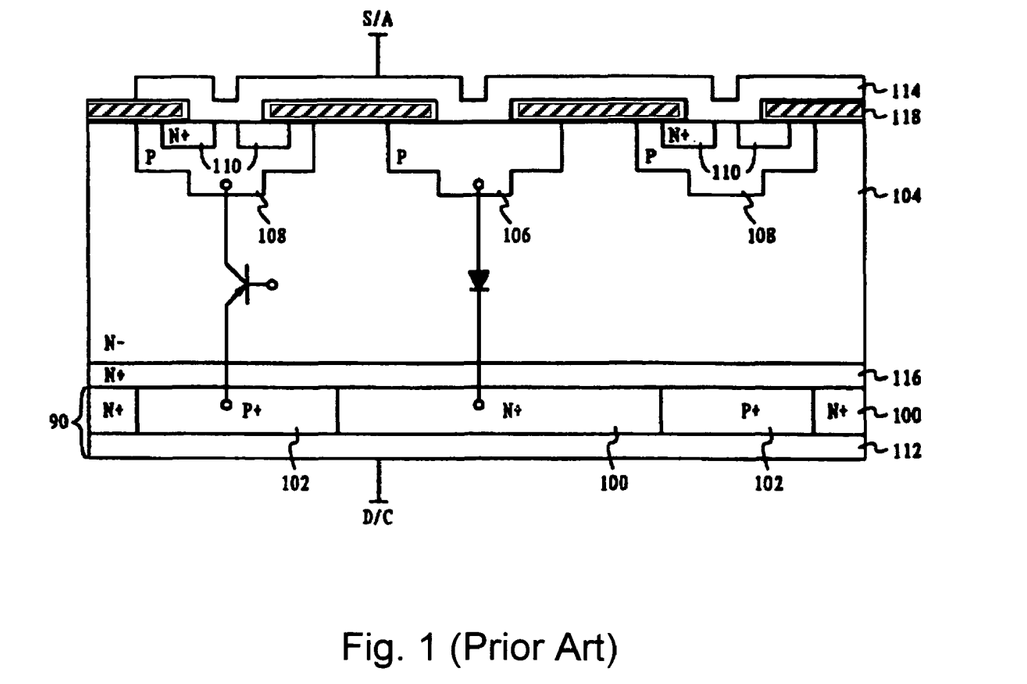
FIG. 1 is a cross sectional view of for showing the configuration of a conventional IGBT.

Conventional device configuration and manufacturing methods for providing the insulated gate bipolar transistor (IGBT) devices are often confronted with two technical difficulties. FIG. 1 illustrates the first technical difficulties of latch-up due to the intrinsic parasitic thyristor formed as NPN and PNP transistors formed in parallel across the collector and emitter. The second technical difficulty is the slow switching speed due to operations of current conduction that involves two electric carriers, i.e., injection of electrons from the N+ emitter and holes from the P+ emitter. After the gate is turned off, the holes move to the body regions but the electrons become extra charged carriers due to shut off of the channel regions. The IGBT device cannot be turned off completely with these extra charged carriers until the extra electrons are combined with holes to achieve significant current reduction. The switching speed of the IGBT devices is adversely affected due to these extra charged carries after turning off the gate.

As a key component in the power electronic systems, the semiconductor power devices are commonly implemented in the power electronic systems such as the power systems for the hybrid, electric or fuel cells vehicles. Recently, there are increasing demands for high performance semiconductor power devices. Particularly, there are increasing demands for high performance high voltage semiconductor power devices such as the insulated gate bipolar transistor (IGBT) devices. However, conventional high voltage semiconductor power devices such as the insulated gate bipolar transistor (IGBT) devices are still confronted with the technical difficulties caused by an increased collector-emitter saturation voltage. The increase of collector-emitter saturation voltage becomes even more pronounced when the IGBT is manufactured with further miniaturized size to increase the cell density of semiconductor power device.

Park discloses in U.S. Pat. Nos. 5,702,961 and 6,051,850 a planar IGBT having built-in freewheeling diodes as shown in FIG. 1. The IGBT device includes an n+ type buffer layer 116, an n-type base layer 104 having a high resistivity, and a deep p-type base layer 108 are formed in the order mentioned on one surface region of a p+ collector layer 102. Also, an n+ emitter layer 110 formed in a part of the surface region of the deep p-type base layer 108. An integral diode comprises deep base 108 and N+ 100.

The IGBT disclosed by Park has a disadvantage due to the deep P base region 108 that is deeper than the base region. This device configuration with a deep base region causes a high JFET resistance between two adjacent contact trenches. The higher JFET resistance further leads to an increase in the collector-emitter saturation voltage. Moreover, the planar IGBT device disclosed by Park has a poor electron injection efficiency due to the current path in a planar IGBT wherein the electrons have to pass through a channel region laterally, and the electrons are transmitted through the JFET region vertically then into drift region.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved insulation gate bipolar transistor (IGBT) power device by forming deep-body dopant regions in the emitter-base contact regions to form deep-body clamping diodes in the IGBT device. The deep-body diodes serve as clamping diodes for both preventing latch up and further improving the switching speed such that the above-discussed technical difficulties and limitations may be resolved.

Another aspect of this invention is to provide a new and improved insulation gate bipolar transistor (IGBT) power device by forming deep-body regions in the emitter-base contact regions in a semiconductor substrate to function as deep-body claiming diodes both in the active cell areas and also on the edge of the active cell area and in the termination. Additional device performance improvements are achieved by forming these deep-body clamping diodes in both the central and edge areas of the active cell region because electron can be efficiently withdrawn from N+ shorting area on collector side when gate bias is turned off for increasing the switching speed. Furthermore, the deep-body dopant regions in the termination area serve the functions of metal field plate thus further improve the device performance of the IGBT device.

Another aspect of this invention is to provide a new and improved insulation gate bipolar transistor (IGBT) power device by forming deep-body regions in the emitter-base contact regions in a semiconductor substrate to function as deep-body claiming diodes both in the active cell areas and also on the edge of the active cell area and in the termination. Additional deep-body clamping diode near the edge of the active cell area is formed with a ring shape surrounding the active cell area and the deep-body clamping diodes are formed either with the ring, stripes, or dot shapes. These configurations further improve additional advantages of increased switching speed.

Briefly in a preferred embodiment, this invention discloses trench insulation gate bipolar transistor (IGBT) power device with a monolithic deep body clamp diode comprising a plurality of trench gates surrounded by emitter regions of a first conductivity type near a top surface of a semiconductor substrate of the first conductivity type encompassed in base regions of a second conductivity type. The trench semiconductor power device further comprises a collector region of the second conductivity type disposed on a rear side opposite from the top surface of the semiconductor substrate corresponding to and underneath the trench gates surrounded by the emitter regions encompassed in the base regions constituting a plurality of insulation gate bipolar transistors (IGBTs). The IGBT power device further includes a deep dopant region of the second conductivity type having P-N junction depth deeper than the base region, disposed between and extending below the trench gates in the base region of the first conductivity type. The IGBT power device further includes a dopant region of the first conductivity type disposed on the rear side of the semiconductor substrate corresponding to and underneath the deep dopant region disposed between the trench gates thus constituting a plurality of deep body diodes. In an exemplary embodiment, the trench IGBT device further includes an insulation layer covering over the top surface over the trench gate and the emitter regions having emitter-base contact trenches opened therethrough between the trench gates and extending to the base layer of the second conductivity type and the deep dopant region wherein each of the emitter-base contact trenches filled with a metal plug for electrically contacting the emitter regions and the base regions. In another exemplary embodiment, the trench IGBT device further includes an emitter-base contact dopant region disposed in the base region of the second conductivity type and the deep dopant implant region surrounding a lower region of the contact trenches and doped with a higher concentration of dopant ions of the second conductivity type than the base region of the second conductivity type. In another exemplary embodiment, the trench IGBT device further includes an active cell area disposed substantially over a central portion of the semiconductor substrate and a termination area disposed near an edge of the semiconductor substrate wherein the termination area further comprising a plurality of the deep dopant regions of the second conductivity type. In another exemplary embodiment, the trench IGBT device further includes an active cell area disposed substantially over a central portion of the semiconductor substrate and a termination area disposed near an edge of the semiconductor substrate wherein the deep dopant implant area is further disposed at an edge of the active cell area between the active cell area and the termination area. In another exemplary embodiment, the emitter-base contact trenches further comprising a barrier layer disposed around sidewalls and a bottom surface of the emitter-base contact trenches surrounding the metal plug filling in the emitter-base contact trenches. In another exemplary embodiment, the metal plug filled in the emitter-base contact trenches further comprising a tungsten plug for electrically contacting the emitter regions and the base regions. In another exemplary embodiment, the emitter-base contact trenches further comprising a barrier layer composed of Ti/TiN disposed around sidewalls and a bottom surface of the emitter-base contact trenches surrounding the metal plug filling in the emitter-base contact trenches. In another exemplary embodiment, the first conductivity type is an N-type conductivity type and the second conductivity type is a P-type conductivity type. In another exemplary embodiment, the first conductivity type is an P-type conductivity type and the second conductivity type is a N-type conductivity type. In another exemplary embodiment, the plurality of deep body diodes further having a breakdown voltage lower than a latch-voltage. In another exemplary embodiment, the IGBT power device further includes an insulation layer covering over the top surface over the trench gate and the emitter regions having emitter-base contact openings opened through the insulation layer for exposing a top surface of the emitter regions; and an emitter metal layer disposed on top of the insulation layer and filling in the emitter-base contact openings for contacting the emitter-base regions. In another exemplary embodiment, the IGBT power device further includes an emitter-base contact dopant region disposed near the top surface of the emitter regions doped with a higher dopant concentration for enhancing an electrical contact with the emitter metal. In another exemplary embodiment, the deep dopant regions of the second conductivity type disposed in an active cell area substantially near a central portion of the semiconductor substrate further having a ring shaped layout constituting a ring-shaped diode substantially surrounding the active cell area of the IGBT device. In another exemplary embodiment, the ring-shaped diode substantially surrounding the active cell area of the IGBT device constituting an outer ring-shaped diode and the IGBT power device further includes an inner ring-shaped diodes disposed as a ring in the active cell area. In another exemplary embodiment, the deep dopant implant regions of the second conductivity type disposed in an active cell area substantially near a central portion of the semiconductor substrate further having a strip shaped layout with stripe shaped diodes substantially extending across the active cell area of the IGBT device. In another exemplary embodiment, the deep dopant regions of the second conductivity type disposed in an active cell area substantially near a central portion of the semiconductor substrate further having a dot-shaped shaped layout with dot-shaped diodes distributed substantially over the active cell area of the IGBT device. In another exemplary embodiment, the IGBT power device further includes an active cell area disposed substantially over a central portion of the semiconductor substrate and a termination area disposed near an edge of the semiconductor substrate wherein the deep dopant area is further disposed at an edge of the active cell area between the active cell area and the termination area constituting a diode near an edge of the active cell area wherein the diode near the edge of the active cell area further having a ring shaped layout constituting a ring-shaped diode disposed on the edge of the active cell area. In another exemplary embodiment, the deep dopant implant regions of the second conductivity type disposed in the active cell area further having a ring shaped layout constituting a ring-shaped diode substantially surrounding the active cell area enclosed by the ring-shaped diode disposed on the edge of the active cell area. In another exemplary embodiment, the deep dopant implant regions of the second conductivity type disposed in the active cell area further having a striped shaped layout constituting a stripe-shaped diode substantially extending across the active cell area and interesting with and terminating at the ring-shaped diode disposed on the edge of the active cell area. In another exemplary embodiment, the deep dopant implant regions of the second conductivity type disposed in the active cell area further having a dot-shaped layout constituting a plurality of dot-shaped diodes substantially distributing in the active cell area and enclosed within the ring-shaped diode disposed on the edge of the active cell area.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2:
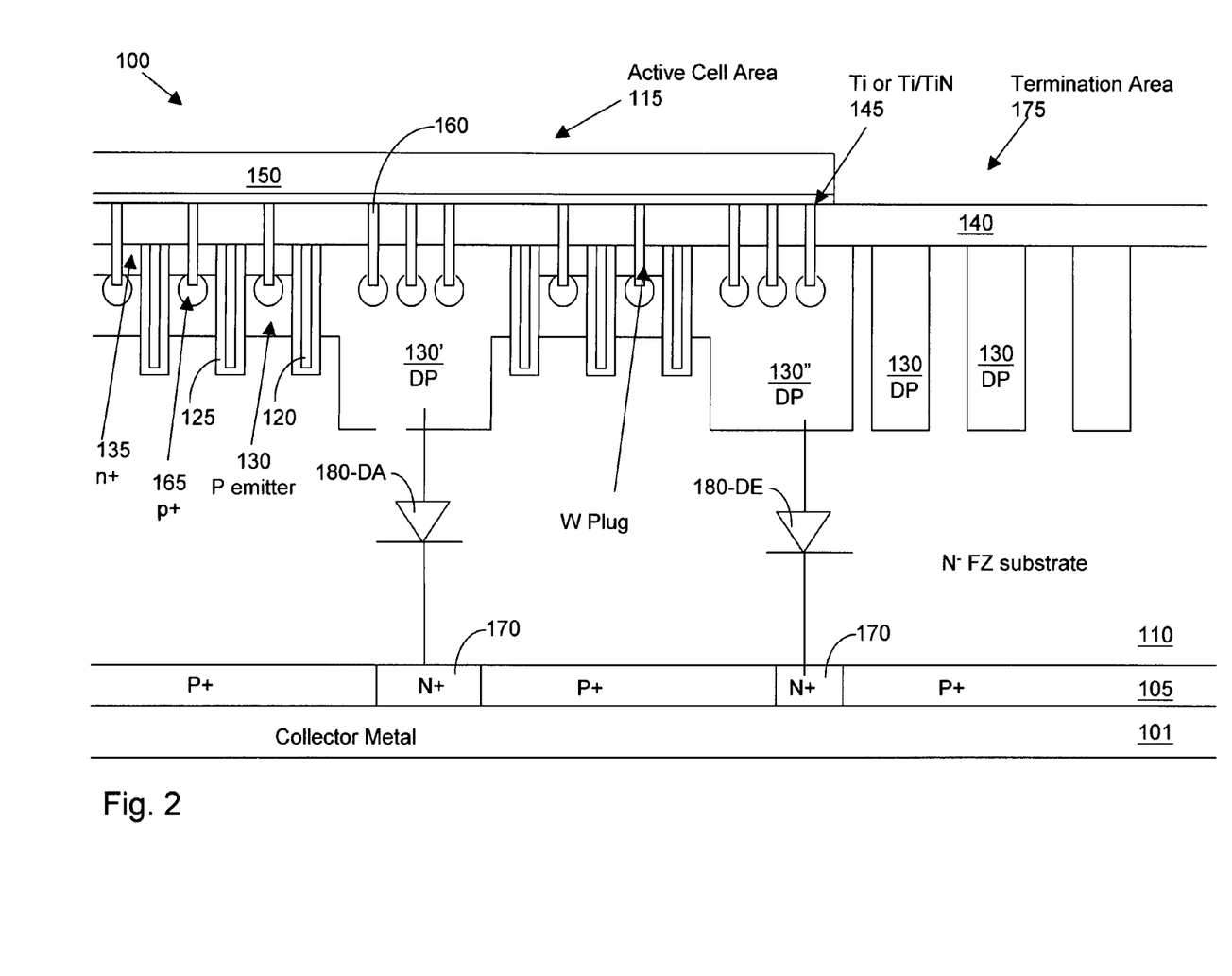
FIGS. 2 to 4 are cross sectional views of alternate embodiments of the present invention of a trenched IGBT devices implemented with deep-body clamping diodes in the emitter-base contact regions of this invention.

Referring to FIG. 2 for a side cross sectional view of an insulated gate bipolar transistor (IGBT) device 100 formed as a vertical power device on a N-semiconductor substrate 110 functioning as an N-base layer. The P+ regions 105 formed at the bottom surface of the substrate 110 function as a collector region with a collector metal 101 formed on the bottom surface. The P+ collector regions further includes N+ dopant regions 170 formed under the deep body regions 130' for connection to a diode 180-DA and 180-DE as will be described below. The P+ collector regions 105 are formed on rear side of the N− substrate 110. The IGBT device further comprises trench gates 120 filled with gate dielectric layer such as polysilicon and padded with gate oxide layer 125. The trench gates are surrounded by P-base regions 130 that encompass N+ emitter regions 135 formed near the top surface of the substrate. The top surface of the substrate is covered with an insulation layer 140 on overlaying an insulation layer (not specifically shown) formed together with the gate insulation layer 125.

The IGBT device further comprises emitter-base contact trenches 160 opened through the insulation layer 140 and padded with a barrier layer (not specifically shown) composed of Ti/TiN or Co/TiN filled with tungsten contact plugs 160 filling in the contact trenches for contacting the emitter regions 135 and the base region 130. Each of these emitter-base contact trenches further are extended into the P-base regions 130 having a P+ dopant region 165 implanted below the contact trenches to reduce the contact resistance and enhance the electrical contact to the emitter-base regions. The top surface of the insulation layer 140 may be covered with a resistance-reduction layer 145 composed of Ti or Ti/TiN for expanding the contact area between the emitter metal 150 to the emitter-base trench contact 160 to reduce the contact resistance.

In addition to the base-emitter trench contact 160 filled with the tungsten plug to reduce the contact resistance, the IGBT device 100 further includes monolithic body diode 180-DA formed with deep P (DP) dopant regions 130' in the active cell areas 115 disposed substantially in the central portions of the substrate with corresponding N+ dopant regions 170 as ohmic contact region for the N portion of PN junction formed near the bottom surface of the substrate 105. The deep P-implant regions 130" and 130-DP are also formed respectively near the edge of the active cell area 115 and in the termination area 175 near the edge of the substrate. The deep P-body implant region 130" forms a diode 180-DE with the N− epitaxial layer 110 and connected to the N+ region 170 below in the substrate 105. The diodes 180-DE formed with the deep P-regions in the termination area serves the function as the clamping diode and also carries out the function similar to that of the metal field plate in the termination area. The deep body regions 130' and 130-DP have a breakdown voltage lower than the latch up voltage by making the deep P regions having heavier dose than the base region and with deeper junction than base region. The device thus formed can therefore prevent the occurrences of the latch-up problems. Therefore, the device shown in FIG. 2 with the deep body regions to form the clamp diode can also provide the benefits of both latch-up prevention and for improving the switching speed. The improvement of switching speed is achieved because electrons are withdrawn at a higher rate when gate bias is turned off through the N+ region 170 compared to the withdrawal rate of the electrons through electron-hole recombination.

Figure 3:
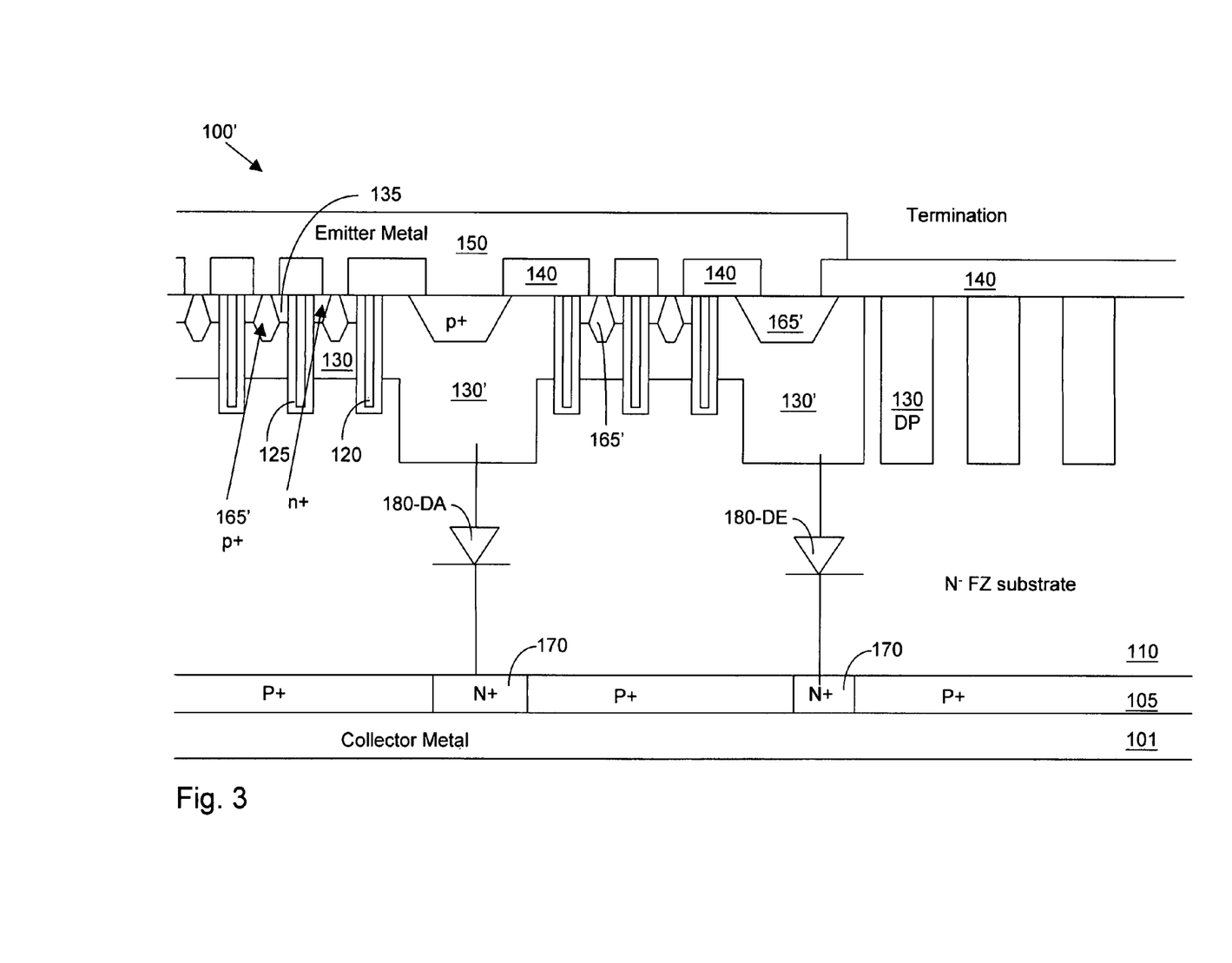

FIG. 3 is a cross sectional view for showing another IGBT device 100' as an embodiment of this invention. The IGBT 100' has a similar structure with the IGBT device 100. Instead of the trench contact 160 as shown in FIG. 2, the IGBT 100' has planar base-emitter contact. The emitter metal layer 150 contacts the P+ contact dopant regions 165 through contact openings in the insulation layer 140 for direct contacting the base-emitter regions.

Figure 4:
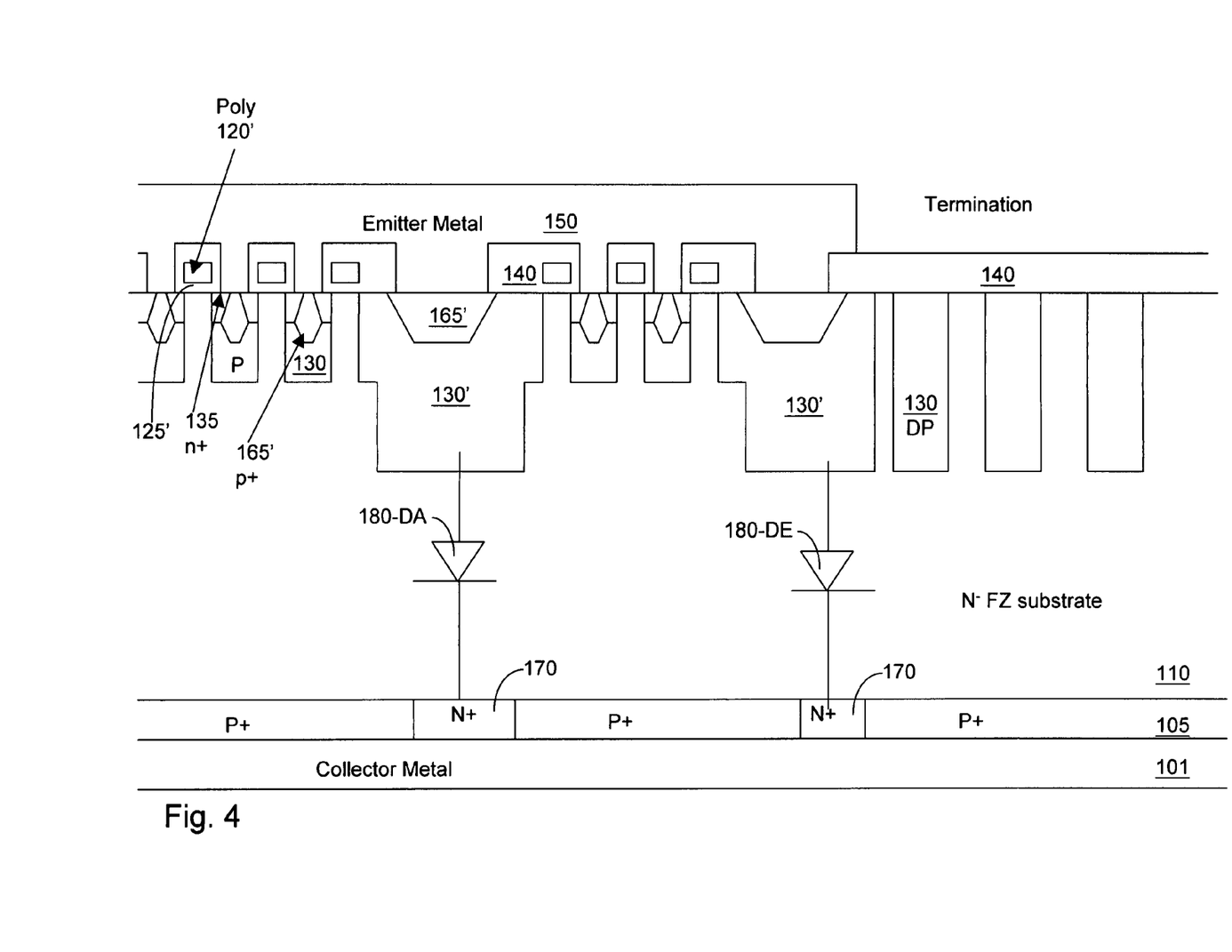

FIG. 4 is a cross sectional view for showing another IGBT device 100" as another embodiment of this invention. The IGBT 100" has a similar structure with the IGBT device 100'. Instead of the trench gate 120 as shown in FIG. 3, the IGBT 100" has planar gate 120' formed with polysilicon and covered with gate oxide layer 125'. Similar to the IGBT 100', the emitter metal layer 150 contacts the P+ contact dopant regions 165 through contact openings in the insulation layer 140 for direct contacting the base-emitter regions.

Figure 5A:
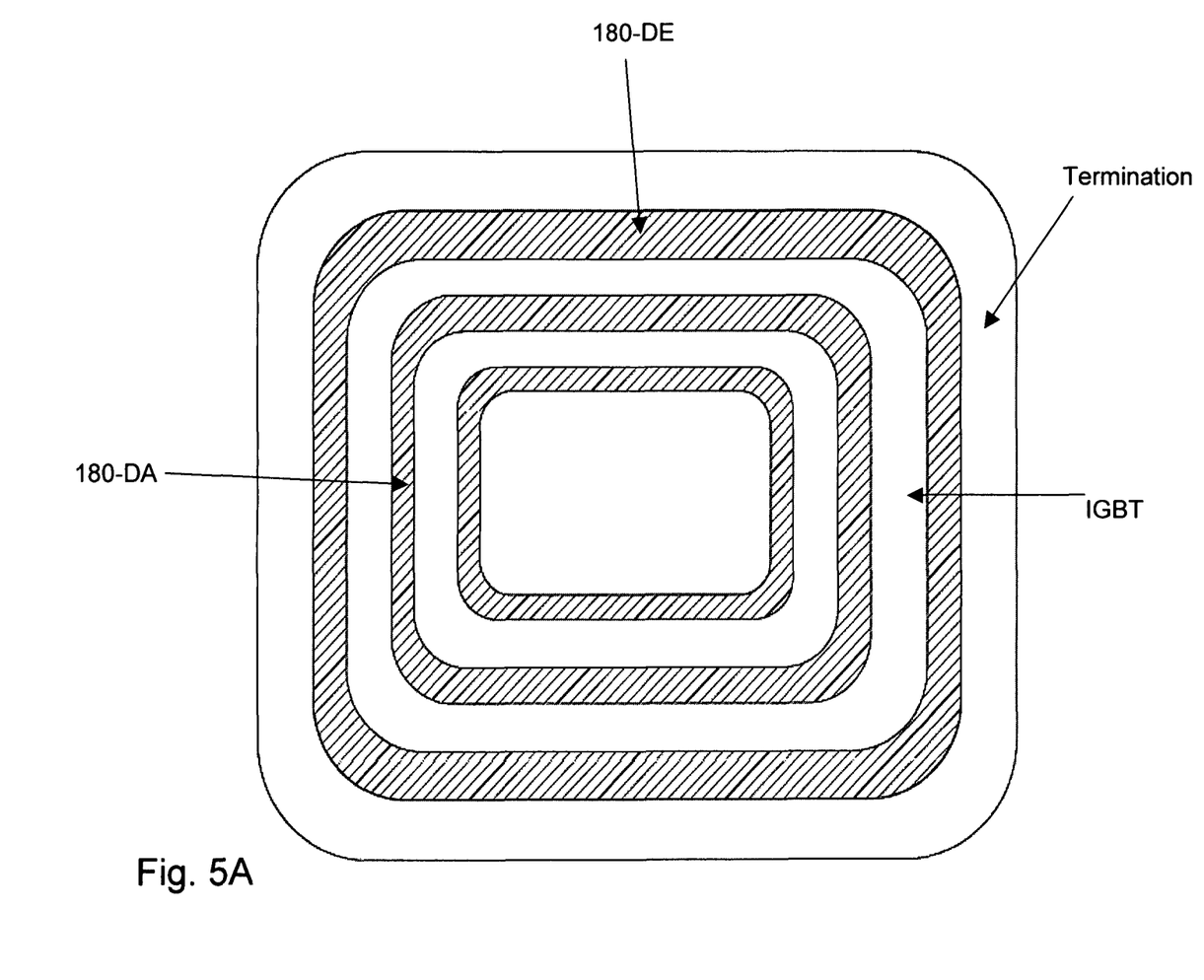
FIGS. 5A to 5C are three top views for illustrating three different layout configurations of the deep-body dopant clamping diodes of this invention.
Figure 5B:
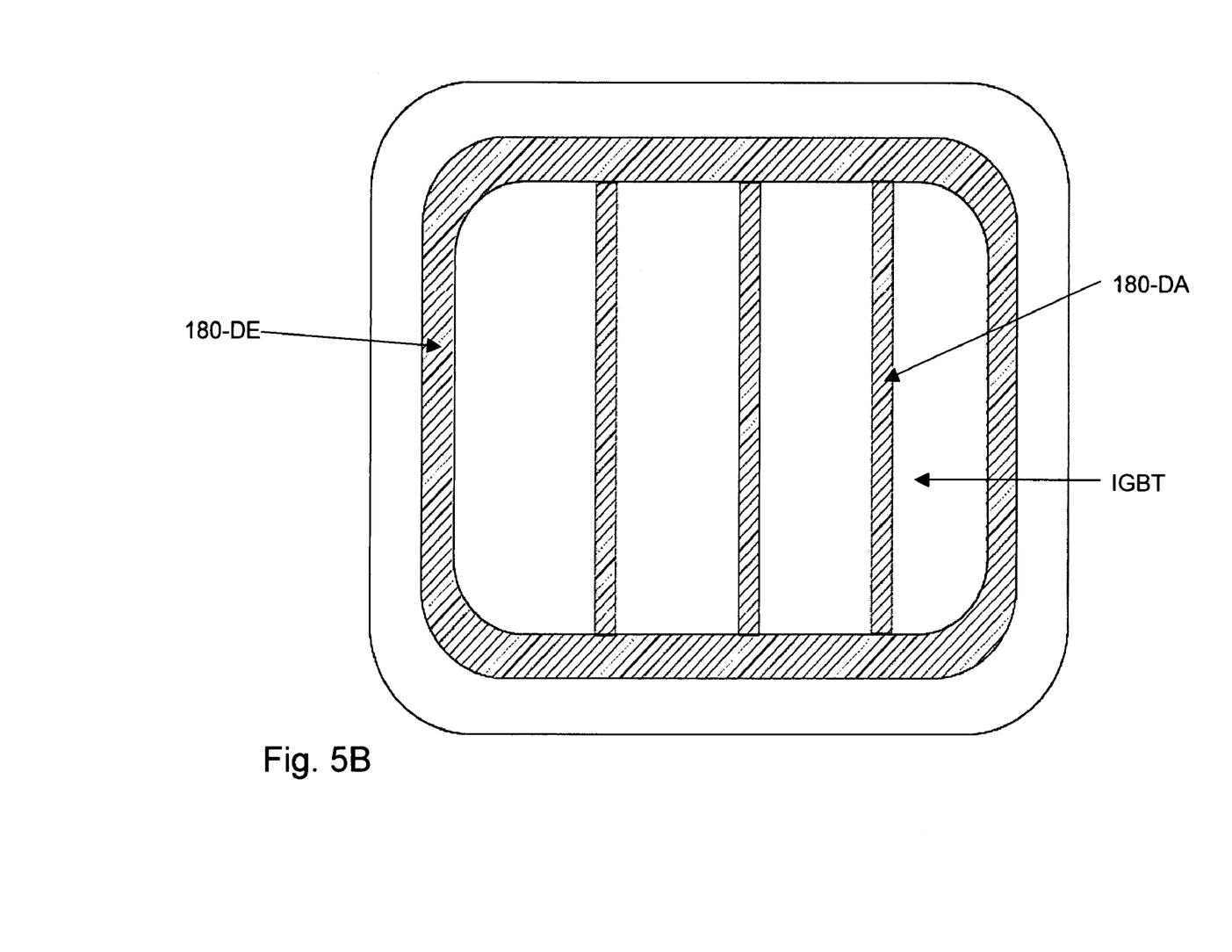
Figure 5C:
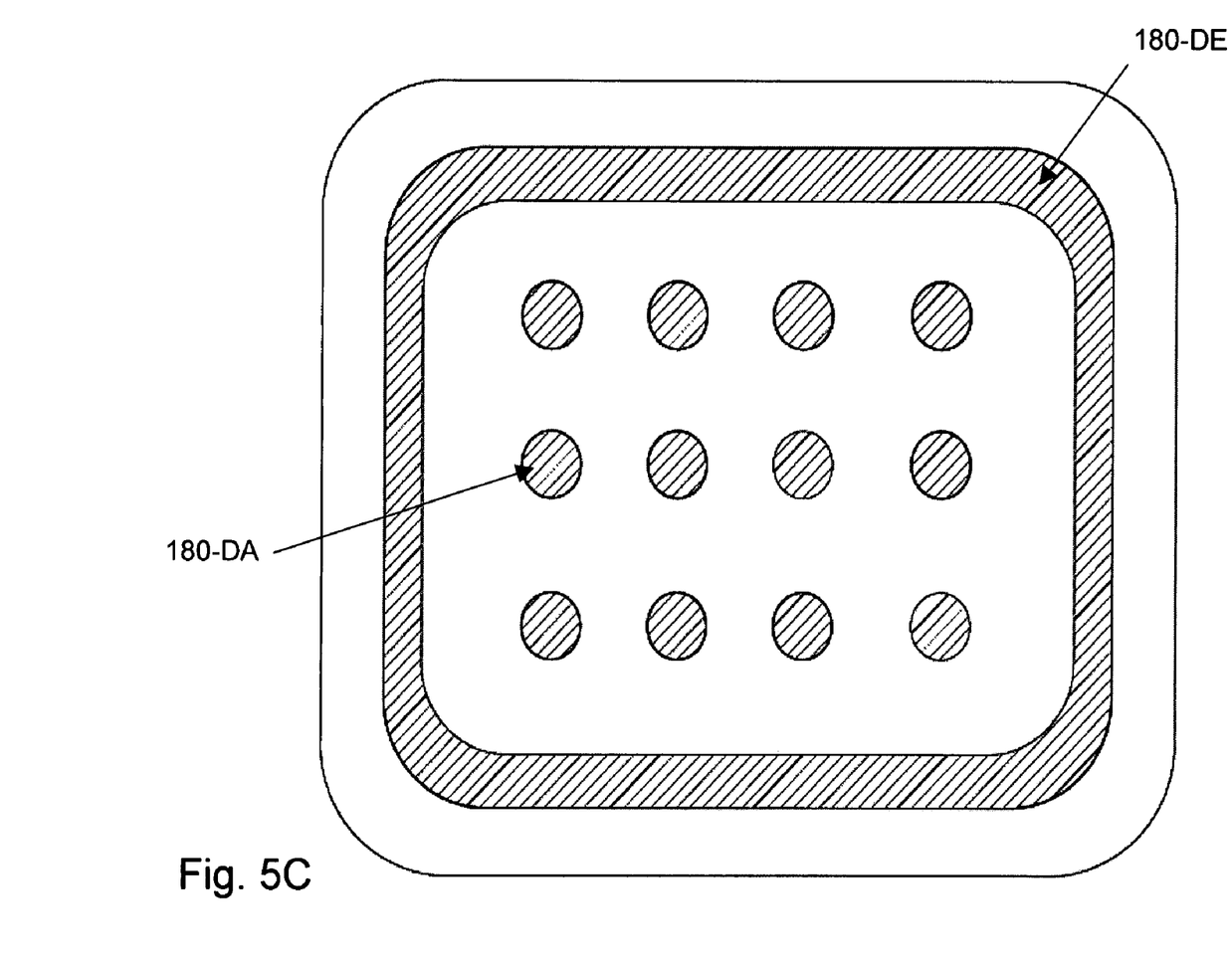

FIGS. 5A to 5C are three top views for showing three layout configurations of the deep-body clamping diodes 180-DA and 180-DE. In FIG. 5A, the deep-body clamping diodes 180-DE and 180-DA are formed as rings. In FIG. 5B, the deep-body clamping diode 18-DA near the edge of the active cell area 115 near the termination area 175 is formed as ring surrounding the IGBT device. The deep-body clamping diodes 180-DE in the active cell area 115 around the central portion of the IGBT device are formed as stripes. In FIG. 5C, the deep-body clamping diode 18-DA near the edge of the active cell area 115 near the termination area 175 is formed as ring surrounding the IGBT device. The deep-body clamping diodes 180-DE in the active cell area 115 around the central portion of the IGBT device are formed as dot shaped diodes. More specifically, the ring-shaped and dotted shaped clamping diode as shown in FIGS. 5A and 5C are preferred for closed cell design while the stripe-shaped clamping diode shown in FIG. 5B is better for stripe cell design.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A trench insulation gate bipolar transistor (IGBT) power device with a monolithic deep body clamp diode comprising a plurality of trench gates surrounded by emitter regions of a first conductivity type near a top surface of a semiconductor substrate of said first conductivity type encompassed in base regions of a second conductivity type, said trench semiconductor power device further comprising:

a collector region of said second conductivity type disposed on a rear side opposite from said top surface of said semiconductor substrate corresponding to and underneath said trench gates surrounded by said emitter regions encompassed in said base regions constituting a plurality of insulation gate bipolar transistors (IGBTs);

a deep dopant region of the second conductivity type having P-N junction depth deeper than said base regions, disposed between and extending below the trench gates in said semiconductor substrate of said first conductivity type; and a dopant region of said first conductivity type disposed on said rear side of said semiconductor substrate corresponding to and underneath said deep dopant region disposed between said trench gates thus constituting a plurality of deep body diodes; and an active cell area disposed substantially over a central portion of the semiconductor substrate and a termination area disposed near an edge of said semiconductor substrate wherein said termination area further comprising a plurality of said deep dopant regions of the second conductivity type.

2. The trench IGBT power device of claim 1 further comprising:
an insulation layer covering over said top surface over said trench gate and said emitter regions having emitter-base contact trenches opened therethrough between said trench gates and extending to said base layer of said second conductivity type and said deep dopant region wherein each of said emitter-base contact trenches filled with a metal plug for electrically contacting said emitter regions and said base regions.

3. The trench IGBT power device of claim 2 further comprising:
an emitter-base contact dopant region disposed in said base region of said second conductivity type, and said deep dopant region surrounding a lower region of said contact trenches and doped with a higher concentration of dopant ions of said second conductivity type than said base region of said second conductivity type.

4. The trench IGBT power device of claim 2 wherein:
said emitter-base contact trenches further comprising a barrier layer disposed around sidewalls and a bottom surface of said emitter-base contact trenches surrounding said metal plug filling in said emitter-base contact trenches.

5. The trench IGBT power device of claim 2 wherein:
said metal plug filled in said emitter-base contact trenches further comprising a tungsten plug for electrically contacting said emitter regions and said base regions.

6. The trench IGBT power device of claim 2 wherein:
said emitter-base contact trenches further comprising a barrier layer composed of Ti/TiN disposed around sidewalls and a bottom surface of said emitter-base contact trenches surrounding said metal plug filling in said emitter-base contact trenches.

7. The trench IGBT power device of claim 1 wherein:
said first conductivity type is an N-type conductivity type and said second conductivity type is a P-type conductivity type.

8. The trench IGBT power device of claim 1 wherein:
said first conductivity type is an P-type conductivity type and said second conductivity type is a N-type conductivity type.

9. The trench IGBT power device of claim 1 wherein:
said plurality of deep body diodes further having a breakdown voltage lower than a latch-up voltage.

10. The trench IGBT power device of claim 1 further comprising:
an insulation layer covering over said top surface over said trench gate and said emitter regions having emitter-base contact openings opened through said insulation layer for exposing a top surface of said emitter regions; and
an emitter metal layer disposed on top of said insulation layer and filling in said emitter-base contact openings for contacting said emitter-base regions.

11. The trench IGBT power device of claim 10 further comprising:
an emitter-base contact dopant region disposed near said top surface of said emitter regions doped with a higher dopant concentration for enhancing an electrical contact with said emitter metal.

12. The trench IGBT power device of claim 1 wherein:
said deep dopant regions of the second conductivity type disposed in an active cell area substantially near a central portion of said semiconductor substrate further having a ring shaped layout constituting a ring-shaped diode substantially surrounding the active cell area of said IGBT device.

13. The trench IGBT power device of claim 12 wherein:
said ring-shaped diode substantially surrounding the active cell area of said IGBT device constituting an outer ring-shaped diode and the IGBT power device further includes an inner ring-shaped diodes disposed as a ring in said active cell area.

14. The trench IGBT power device of claim 1 wherein:
said deep dopant implant regions of the second conductivity type disposed in an active cell area substantially near a central portion of said semiconductor substrate further having a strip shaped layout with stripe shaped diodes substantially extending across the active cell area of said IGBT device.

15. The trench IGBT power device of claim 1 wherein:
said deep dopant implant regions of the second conductivity type disposed in an active cell area substantially near a central portion of said semiconductor substrate further having a dot-shaped shaped layout with dot-shaped diodes distributed substantially over the active cell area of said IGBT device.

16. The trench IGBT power device of claim 1 wherein:
an active cell area disposed substantially over a central portion of the semiconductor substrate and a termination area disposed near an edge of said semiconductor substrate wherein said deep dopant area is further disposed at an edge of said active cell area between said active cell area and said termination area constituting a diode near an edge of said active cell area wherein said diode near said edge of said active cell area further having a ring shaped layout constituting a ring-shaped diode disposed on said edge of said active cell area.

17. The trench IGBT power device of claim 16 wherein:
said deep dopant regions of the second conductivity type disposed in said active cell area further having a ring shaped layout constituting a ring-shaped diode substantially surrounding the active cell area enclosed by said ring-shaped diode disposed on the edge of said active cell area.

18. The trench IGBT power device of claim 16 wherein:
said deep dopant regions of the second conductivity type disposed in said active cell area further having a striped shaped layout constituting a stripe-shaped diode substantially extending across said active cell area and interesting with and terminating at said ring-shaped diode disposed on the edge of said active cell area.

19. The trench IGBT power device of claim 16 wherein:
said deep dopant regions of the second conductivity type disposed in said active cell area further having a dot-shaped layout constituting a plurality of dot-shaped diodes substantially distributing in said active cell area and enclosed within said ring-shaped diode disposed on the edge of said active cell area.

20. A trench IGBT power device with a monolithic deep body clamp diode comprising a plurality of trench gates surrounded by emitter regions of a first conductivity type near a top surface of a semiconductor substrate of said first conductivity type encompassed in base regions of a second conductivity type, said trench semiconductor power device further comprising:
a collector region of said second conductivity type disposed on a rear side opposite from said top surface of said semiconductor substrate corresponding to and underneath said trench gates surrounded by said emitter regions encompassed in said base regions constituting a plurality of insulation gate bipolar transistors (IGBTs);

a deep dopant region of the second conductivity type having P-N junction depth deeper than said base regions, disposed between and extending below the trench gates in said semiconductor substrate of said first conductivity type; and a dopant region of said first conductivity type disposed on said rear side of said semiconductor substrate corresponding to and underneath said deep dopant region disposed between said trench gates thus constituting a plurality of deep body diodes; and an active cell area disposed substantially over a central portion of the semiconductor substrate and a termination area disposed near an edge of said semiconductor substrate wherein said deep dopant area is further disposed at an edge of said active cell area between said active cell area and said termination area forming deep body clamp diode with said dopant region of said first conductivity type on rear side of said semiconductor substrate.

* * * * *